United States Patent
Nash et al.

(10) Patent No.: US 7,965,991 B2
(45) Date of Patent: Jun. 21, 2011

(54) PHASE CALIBRATION FOR MULTIPLE TRANSMITTER SYSTEMS

(75) Inventors: Gregory T. Nash, Arlington Heights, IL (US); Steven G. Van Gheem, Gilberts, IL (US)

(73) Assignee: Motorola Mobility, Inc., Libertyville, IL (US)

(*) Notice: Subject to any disclaimer, the term of this patent is extended or adjusted under 35 U.S.C. 154(b) by 488 days.

(21) Appl. No.: 12/249,256

(22) Filed: Oct. 10, 2008

(65) Prior Publication Data
US 2010/0093289 A1 Apr. 15, 2010

(51) Int. Cl.
*H03C 1/62* (2006.01)
*H04B 17/00* (2006.01)

(52) U.S. Cl. ............... 455/115.2; 455/67.11; 455/67.14; 455/67.16

(58) Field of Classification Search ............... 455/67.11, 455/67.14, 67.16, 115.1, 115.2, 127.1
See application file for complete search history.

(56) References Cited

U.S. PATENT DOCUMENTS

| 4,814,730 | A | 3/1989 | Via et al. |
| 4,918,388 | A | 4/1990 | Mehdizadeh et al. |
| 6,819,181 | B2 | 11/2004 | Stengel et al. |
| 7,764,935 | B2* | 7/2010 | Pallonen et al. ........... 455/115.1 |
| 2003/0095012 | A1* | 5/2003 | Chethik et al. ............... 332/103 |
| 2004/0219892 | A1* | 11/2004 | Vaidyanathan et al. ...... 455/103 |
| 2005/0018787 | A1 | 1/2005 | Saed |

FOREIGN PATENT DOCUMENTS

WO 2005060122 A1 6/2005

* cited by examiner

*Primary Examiner* — Tuan A Pham

(57) ABSTRACT

A method, wireless communication device, and a base station calibrate relative phase of a plurality of output signals from respectively combined plurality of transmitters (302, 204) in the wireless device (102, 108). An output of a combiner (346) is disconnected (504) from an antenna port (306) of a wireless device (102, 108). A phase position of an output signal from one of the at least two transmitters is set to an initial phase position value (506). The phase position of the output signal is incremented by a given phase increment value until a final phase position value is reached (510). Occurrences of reverse power alarm events are monitored at the initial phase position value, at each incremental phase position value, and at the final phase position value (512). A phase position value for the output signal is selected (516).

20 Claims, 6 Drawing Sheets

PHASE CALIBRATION FOR MULTIPLE TRANSMITTER SYSTEMS

FIELD OF THE INVENTION

The present invention generally relates to the field of wireless communications, and more particularly relates to calibrating the phase of a multiple transmitter system.

BACKGROUND OF THE INVENTION

Wireless communication technology has evolved greatly over the recent years. Wireless devices and wireless communication equipment such as base stations are now able to include multiple transmitters that transmit different signals using the same antenna. However, to coherently combine multiple transmitters so that a single antenna can be used each transmitter is required to be phase aligned.

To calibrate a multi-transmitter system, conventional manual calibration methods are generally only performed once by technicians at the factory since this is the only time the technician can interface the radio/transmitter with bench equipment, such as an RF power meter, to identify the in-phase points from the radio/transmitter output. These conventional methods are normally manual and time consuming requiring numerous slow speed communications, and manual procedures by the technician, between the radio/transmitter, calibration bench equipment, and power meter. Furthermore, if a problem arises in the field, cumbersome testing/repair equipment, and technical personnel, need to be transported to the transmitter site and/or the failing equipment needs to be sent to a repair facility.

SUMMARY OF THE INVENTION

In one embodiment, a new and novel method autonomously, and without manual intervention, calibrates relative phase of a plurality of output signals from respectively combined plurality of transmitters in the wireless device. An output of a combiner is disconnected from an antenna port of a wireless device. The combiner combines separate output signals from at least two transmitters in the wireless device into a single combined signal. A phase position of an output signal from one of the at least two transmitters is set to an initial phase position value. The phase position of the output signal is incremented by a given phase increment value until a final phase position value is reached. Occurrences of reverse power alarm events are monitored at the initial phase position value, at each incremental phase position value, and at the final phase position value. A phase position value for the output signal is selected based on the monitoring.

In another embodiment, a wireless communication device calibrates relative phase of a plurality of output signals from respectively combined plurality of transmitters in the wireless communication device. The wireless communication device includes a memory and a processor communicatively coupled to the memory. At least two transmitters are included in the wireless communication with one of the at least two transmitters comprising a phase adjuster. A combiner is communicatively coupled to the at least two transmitters. The combiner combines separate output signals from at the least two transmitters into a single combined signal. An antenna is communicatively coupled to the at least two transmitters. A switch is communicatively coupled to the antenna and the combiner. A controller is communicatively coupled at least the memory, the processor, the switch, and the at least two transmitters. The controller is adapted to autonomously, and without user intervention, activate the switch to disconnect an output of the combiner from the antenna. A phase position of an output signal from one of the at least two transmitters is set, via the phase adjuster, to an initial phase position value. The phase position of the output signal is incremented by a given phase increment value until a final phase position value is reached. Occurrences of reverse power alarm events are monitored at the initial phase position value, at each incremental phase position value, and at the final phase position value. A phase position value for the output signal is selected based on the monitoring.

In yet another embodiment, a wireless device calibrates relative phase of a plurality of output signals from respectively combined plurality of transmitters in the wireless communication device. The wireless device includes a memory and a processor communicatively coupled to the memory. At least two transmitters are included in the wireless communication with one of the at least two transmitters comprising a phase adjuster. A combiner is communicatively coupled to the at least two transmitters. The combiner combines separate output signals from at the least two transmitters into a single combined signal. An antenna is communicatively coupled to the at least two transmitters. A controller is communicatively coupled at least the memory, the processor, and the at least two transmitters. The controller is adapted to disconnect an output of the combiner from the antenna. A phase position of an output signal from one of the at least two transmitters is set, via the phase adjuster, to an initial phase position value. The phase position of the output signal is incremented by a given phase increment value until a final phase position value is reached. Occurrences of reverse power alarm events are monitored at the initial phase position value, at each incremental phase position value, and at the final phase position value. A phase position value for the output signal is selected based on the monitoring.

BRIEF DESCRIPTION OF THE DRAWINGS

The accompanying figures where like reference numerals refer to identical or functionally similar elements throughout the separate views, and which together with the detailed description below are incorporated in and form part of the specification, serve to further illustrate various embodiments and to explain various principles and advantages all in accordance with the present invention.

DETAILED DESCRIPTION

As required, detailed embodiments of the present invention are disclosed herein; however, it is to be understood that the disclosed embodiments are merely examples of the invention, which can be embodied in various forms. Therefore, specific structural and functional details disclosed herein are not to be interpreted as limiting, but merely as a basis for the claims and as a representative basis for teaching one skilled in the art to variously employ the present invention in virtually any appropriately detailed structure. Further, the terms and phrases used herein are not intended to be limiting; but rather, to provide an understandable description of the invention. Additionally, the invention shall have the full scope of the claims and shall not be limited by the embodiments shown below.

The terms "a" or "an", as used herein, are defined as one or more than one. The term plurality, as used herein, is defined as two or more than two. The term another, as used herein, is defined as at least a second or more. The terms including and/or having, as used herein, are defined as comprising (i.e., open language). The term coupled, as used herein, is defined as connected, although not necessarily directly, and not necessarily mechanically. It is further understood that the use of relational terms, if any, such as first, second, top and bottom, front and rear, and the like are used solely for distinguishing one entity or action from another, without necessarily requiring or implying any such actual relationship or order between such entities or actions.

For purposes of this application the term "wireless device" is intended to broadly cover many different types of devices that can wirelessly transmit signals, and optionally can wirelessly receive signals, and may also operate in a wireless communication system. For example, and not for any limitation, a wireless device can include (but is not limited to) any one or a combination of the following: a two-way radio, a cellular telephone, a mobile phone, a smartphone, a two-way pager, a wireless messaging device, a laptop/computer, automotive gateway, or a residential gateway.

Figure 1:
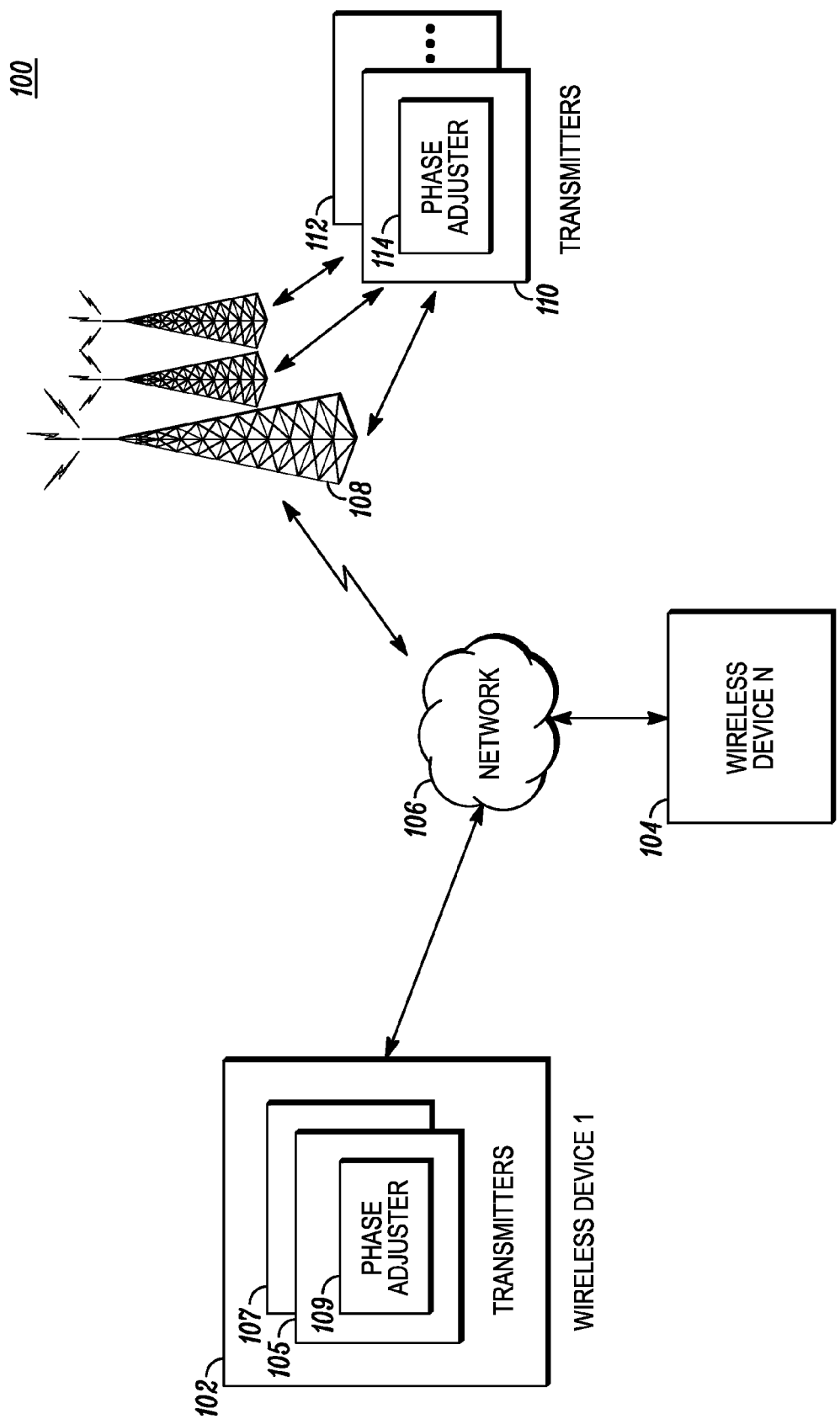
FIG. 1 is block diagram illustrating an operating environment according to one embodiment of the present invention.

According to one embodiment of the present invention as shown in FIG. 1 one example of a wireless communication system 100 is illustrated. In particular, FIG. 1 shows one or more wireless devices 102, 104 communicatively coupled to one or more wireless communication networks 106. Each wireless device 102, 104 includes one or more transmitters 105, 107. In an embodiment where multiple transmitters are implemented, one or more of the transmitters include a phase adjuster 109, which is discussed in greater detail below. It should be noted that although FIG. 1 shows two wireless devices, the wireless communication system 100 supports any number of wireless devices 102, 104, which can be single mode or multi-mode devices. Multi-mode devices are capable of communicating over multiple access networks with varying technologies. For example, a multi-mode wireless device can communicate over various access networks such as GSM, UMTS, CDMA, or WiFi. In addition, multiple communication protocols such as Push-To-Talk (PTT), Push-To-Talk Over Cellular (PoC), voice traffic channel, multimedia messaging, web browsing, Voice over IP (VoIP), and multimedia streaming may be utilized.

The wireless communication network 106 can include one or more networks such as a circuit service network and/or a packet data network. The communication network 106 can either be wired or wireless. The wireless communications standard of the network 106 can comprise Code Division Multiple Access ("CDMA"), Time Division Multiple Access ("TDMA"), Global System for Mobile Communications ("GSM"), General Packet Radio Service ("GPRS"), Frequency Division Multiple Access ("FDMA"), other IEEE 802.16 standards, Orthogonal Frequency Division Multiplexing ("OFDM"), Orthogonal Frequency Division Multiple Access ("OFDMA"), Wireless LAN ("WLAN"), WiMAX, or the like. The wireless communication network 106 is able to include an IP or SIP based connectivity network, which provides data connections at much higher transfer rates then a traditional circuit services network. These networks are able to comprise an Evolution Data Only ("EV-DO") network, a General Packet Radio Service ("GPRS") network, a Universal Mobile Telecommunications System ("UMTS") network, an 802.11 network, an 802.16 (WiMAX) network, Ethernet connectivity, dial-up modem connectivity, or the like. A circuit services network is able to provide, among other things, voice services to the wireless devices 102, 104 communicatively coupled to the network 106. Other applicable communications standards include those used for Public Safety Communication Networks including TErrestrial TRunked rAdio ("TETRA") and P25 Trunking. It should be noted that these network technologies are only used as an illustrative example and do not limit further embodiments of the present invention.

The wireless communication system 100 also includes one or more base stations 108 communicatively coupled to the wireless communication network(s) 106. Each base station 108 is includes a plurality of transmitters 110, 112. One or more of these transmitters 110, 112 include a phase adjuster 114 for autonomously calibrating the phase of the multiple transmitters. Two or more of the transmitters in the plurality of transmitters are communicatively coupled to the same antenna at the base station 108. Stated differently, two or more transmitters are coherently combined and communicatively coupled to a single antenna. Therefore, multiple transmissions with varying signals can occur at substantially the same time through the same antenna. This is also true for a multi-mode wireless device 102, 104 comprising multiple transmitters coupled to a single antenna.

Figure 2:
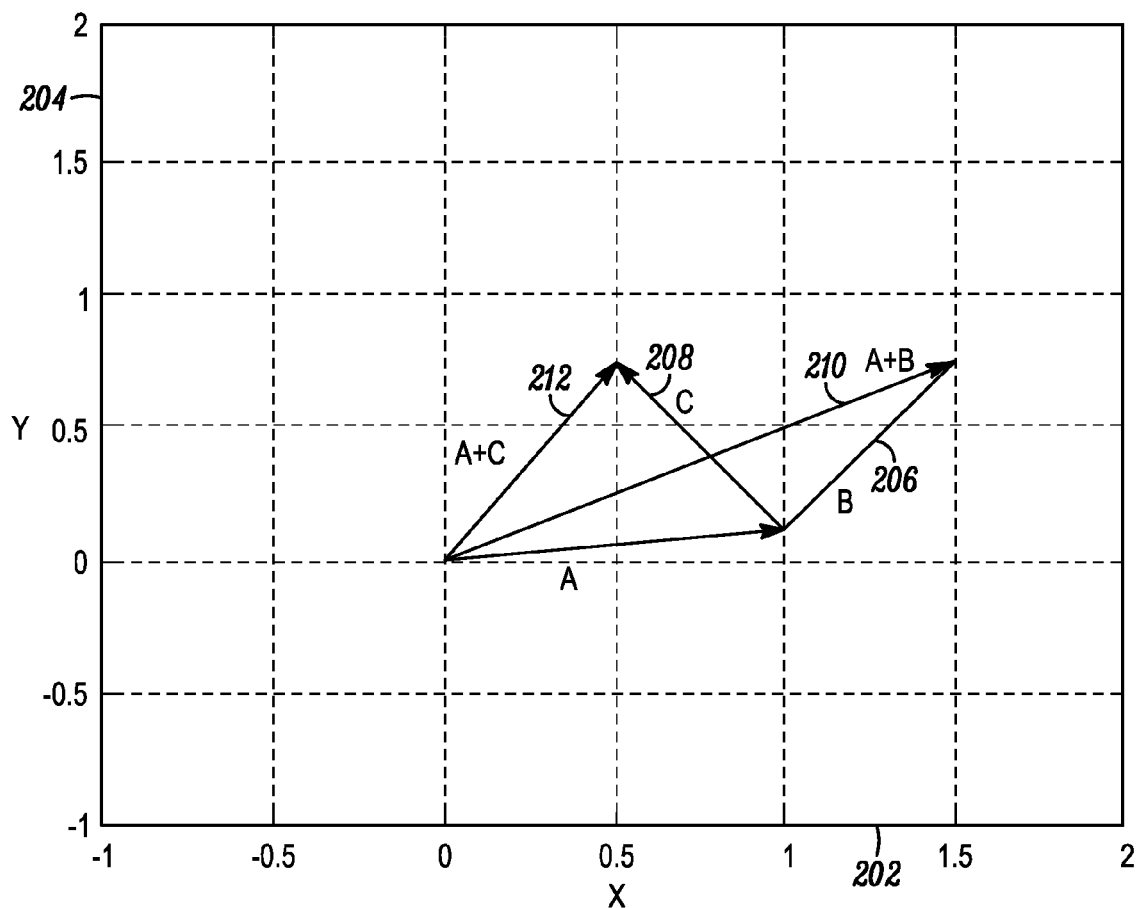
FIG. 2 is a graph illustrating the effect of phase one combining.

As discussed above, to coherently combine multiple transmitters, each transmitter is required to be phase aligned. If the transmitters are not phase aligned reflected power can be occur, which can cause QoS issues, damage to the antenna, and damage to the transmitters. When combining two or more transmit branches coherently, the difference in delay produces a difference in the phase of the radio frequency ("RF") signals. This phase difference usually causes the power from each transmitter to add together or cancel each other out. For example, this principle is illustrated in FIG. 2. FIG. 2 is a graph 200 that illustrates phase on the x-axis 202 and amplitude on the y-axis 204. As can be seen from FIG. 2 vector B 206 and vector C 208 have the same amplitude, but a different phase. Performing vector addition produces amplitudes that are very different, as can be seen with vector A+B 210 and vector A+C 212.

Figure 3:
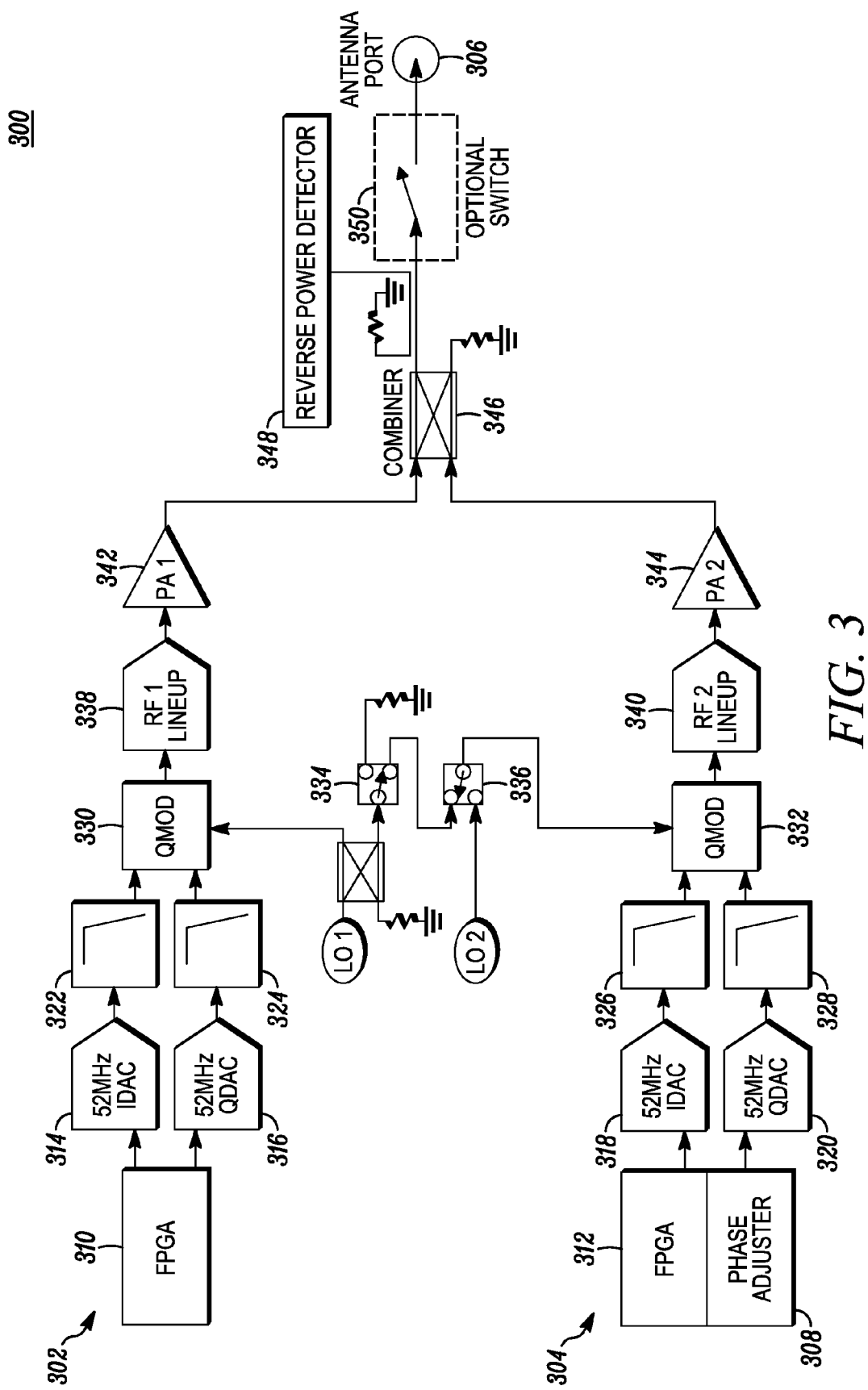
FIG. 3 is a schematic of a multi-transmitter system according to one embodiment of the present invention.

Multiple transmitter systems generally do not include a power detector after a combiner to determine the effect of this power addition or cancellation. However, these transmitter systems usually include a reverse power or voltage standing wave ratio ("VSWR") detector to identify antenna faults and to protect the system from being operated during improper loading. FIG. 3 shows a more detailed view of an example of a transmitter system 300, which in this example comprises two transmitters 302, 304 that are combined and whose combined output is electrically coupled to an antenna of a base station 108 via an antenna port 306. In one embodiment, each of the transmitters 302, 304 comprise a conventional configuration except for a phase adjuster 308. It is assumed that the reader is familiar with wireless transmitters. To simplify the present discussion, only that portion of a transmitter that is relevant to the present invention is discussed in detail.

For example, each transmitter 302, 304 includes a field programmable gate array ("FPGA") 310, 312 electrically coupled to in-phase digital-to-analog converters ("IDAC") 314, 316, 318, 320. The IDACs 314, 316, 318, 320 translate the signal from the FPGAs 310, 312 into a baseband analog form. The IDACs 314, 316, 318, 320 are electrically coupled to filters 322, 324, 326 328, which, in one embodiment, are low pass filters that remove higher frequency aliases. The filters 322, 324, 326 328 are electrically coupled to a quadrature modulator ("Qmod") 330, 332, that moves the baseband signal to RF. The Qmod 330, 332 is electrically coupled to one or more switches 334, 336 and an RF lineup 338, 340.

The switching network 334, 336 can be used to provide the same reference from one LO in the in-phase combine application. The RF lineup 338, 340 is electrically coupled to a power amplifier ("PA") 342, 344 that is electrically coupled to a combiner 346. The RF lineup 338, 340 and the PA 342, 344 provide the necessary gain. The combiner 346 combines the signals of each transmitter 302, 304. A reverse power detector 348 is electrically coupled to the combiner 348 for detecting reverse power. A switch 350, which can be a manual switch or a remote switch such as a radio frequency ("RF") switch, disconnects or open-circuits the combiner 346 output from the antenna port 306. To simplify the present description, only that portion of a wireless communication device that is relevant to the present invention is discussed such as the phase adjuster 308 disposed within the FPGA 312 of one or more of the transmitters. It should be noted that the phase adjuster 308 is not limited to being disposed within a FPGA 312.

To calibrate a multi-transmitter system, conventional calibration methods are generally only performed once at the factory by test technicians since this is the only time the radio/transmitter can be interfaced with a power meter to identify the in-phase points. These conventional methods are manual and time consuming because numerous slow speed communications and procedures need to be made by test technicians between the radio/transmitter, calibration bench, and power meter. Furthermore, if a problem arises in the field, cumbersome testing/repair equipment needs to be transported to the site and/or the failing equipment needs to be sent to a repair facility.

Various embodiments, on the other hand, implement a phase adjuster 308 in one or more of the combined transmitters 302, 304 that utilize reverse power alarms to calibrate the phase of the transmitter output signals. Utilizing the reverse power alarms for phase calibration is advantageous because the calibration components, such as including the reverse power detector circuits 348, can already be present within the radio/transmitter system, and the radio/transmitter already maintains reverse power alarm information, which results in a much faster calibration process (e.g., less than 1 second) while not adding cost of additional hardware components to calibrate the phase of the transmitter output signals.

In one embodiment, the phase adjuster 308 is disposed within the FPGA 312 of one or more of the transmitters 302, 304 being combined. Such phase adjuster 308 can be controlled by a controller, such as the controller 602 shown in FIG. 6 which will be discussed in more detail below. However, it should be noted that the present invention is not limited to the phase adjuster 308 being disposed within an FPGA 312. In particular, for example, the controller 602 begins to monitor the reverse power alarms once the antenna is decoupled from the radio/transmitter 302, 304 (i.e. the radio/transmitter output is disconnected from the antenna port 306).

The radio/transmitter output is disconnected from the antenna so that transmit power is reflected back to the transmitters 302, 304. The radio/transmitter output can be disconnected from the antenna manually by a human operator either physically disconnecting the output or by opening a switch 350 disposed between the combiner 346 and antenna port 306 of the transmitter system 300. The human operator can operate the switch 350 at the transmitter system 300 by himself/herself, or can operate the switch remotely via remote controls that operate the switch 350. Alternatively, the transmitter system 300 can automatically, autonomously, and without manual intervention, disconnect the antenna from the transmitter output to implement a self-calibration process. For example, the system can automatically control the switch 350, so that the combiner output is disconnected from the antenna port 306. According to one embodiment, a controller (such as controller 602 shown in FIG. 6), in response to determining that a self-calibration event has occurred, can automatically operate the switch 350 to disconnect the transmitter output from the antenna and start a self-calibration process. One such event may occur due to the controller 602 detecting a problem occurring at the transmitter system 300. Another example of a self-calibration event may be the controller 602 detecting an input signal that triggers a start of a self-calibration process, such as during a manufacturing process for the transmitter system 300. In another embodiment, the controller 602 can operate the switch 350 to disconnect the transmitter output from the antenna at scheduled maintenance (self-calibration) intervals to keep the transmitting system 300 performing within optimal specifications.

With the transmitter output disconnected from the antenna, the controller 602 controlling the phase adjuster 308 can automatically, autonomously, and without manual intervention, calibrate the relative phase of the transmitters 302, 304. To perform the calibration, in one example of a self-calibration process, the phase adjuster 308 sets itself to 0 degrees phase position value for an output signal from at least one of the transmitters 302, 304, and monitors the reverse power detector 348 for any generated reverse power alarms. A reverse power alarm is generated when the output signals of the two transmitters 302, 304 are substantially in-phase. In other words, in-phase signals generate enough reverse power to generate a reverse power alarm, while out-of-phase signals typically do not.

The controller 602 controls the phase adjuster 308 and thereby continues to increment (shift) the phase position value of the output signal by a given phase increment value until reaching a 360 degrees (or equivalent) phase position value. For each of these incremental steps (phase position values) the controller 602 monitors and records if a reverse power alarm has occurred or failed to occur. Once the alarm or non-alarm events have been recorded for each incremental phase shift step the controller 602 identifies a "middle" (optimum) phase position value for the output signal of when a reverse power alarm has occurred. In other words, the controller 602 analyzes all of the occurrences (or non-occurrences) of reverse power alarms at the various phase position values of the output signal and selects a relative phase for the output signal that is substantially in a middle position of all of the phase position values indicating occurrence of reverse power alarms. Stated differently, the controller 602 operating the phase adjuster 308 identifies an optimum phase of an output signal by selecting the phase angle of the output signal from a substantially middle position of the group of phase positions that generated reverse power alarms.

Figure 4:
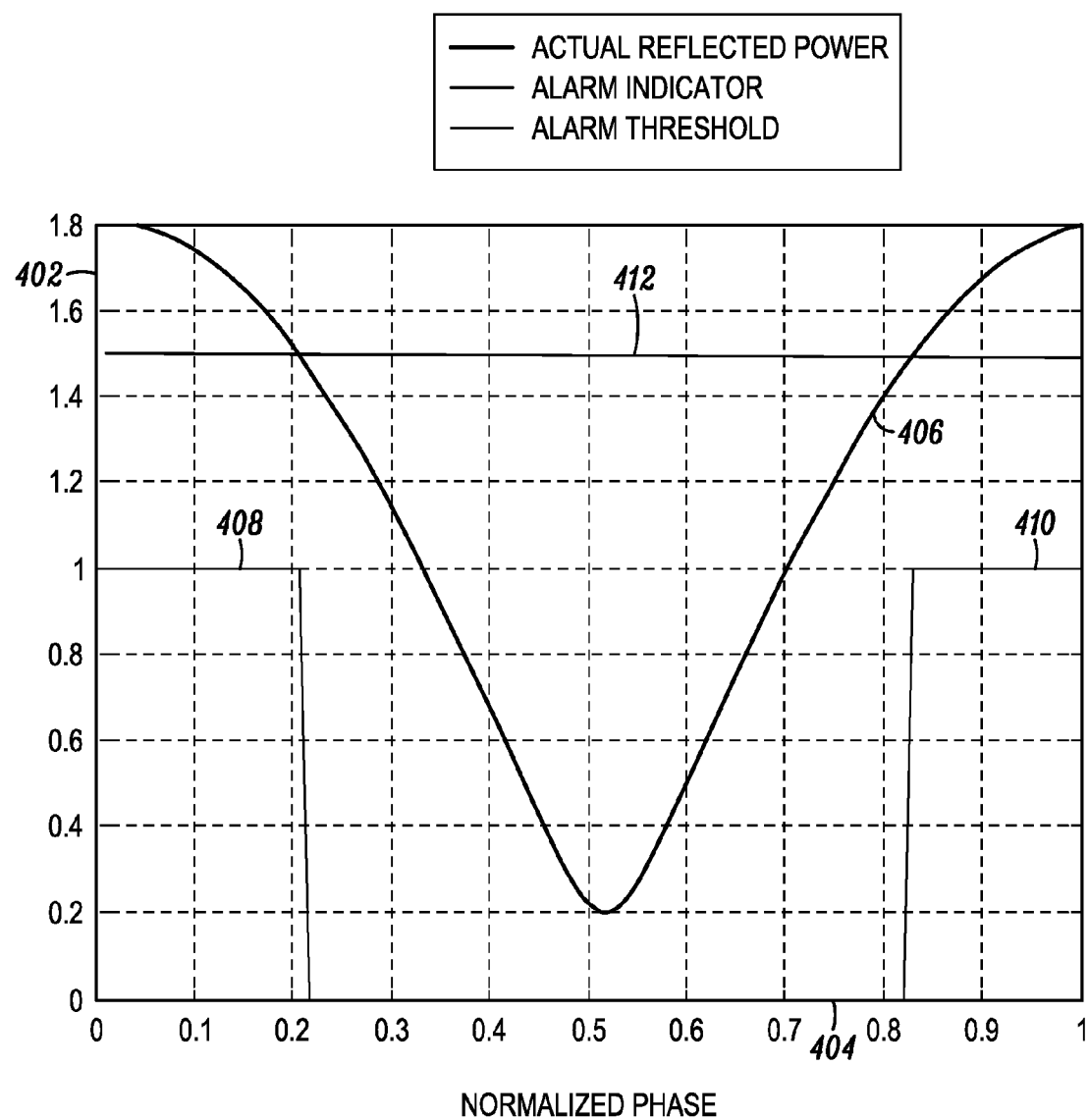
FIG. 4 is a graph illustrating power vs. phase with alarms according to one embodiment of the present invention.

For example, FIG. 4 shows a graph 400 of a measured reflected power (y-axis 402) vs. normalized phase position (x-axis 404). This graph 400 also generally corresponds to the graph of vectors shown in FIG. 2. As can be seen, the reflected (reverse) power over the various normalized phase positions follows a curve 406. The levels of reflected (reverse) power at the certain phase positions are sufficiently high to trigger reverse power alarms, such as indicated by curves 408, 410.

Such alarms could occur when the outputs of the transmitters (e.g., at the outputs of the power amplifiers 342, 344) are improperly loaded (which is done on purpose by opening the switch 350 in these illustrative embodiments to generate a reverse power alarm). The example shown in FIG. 4 also indicates that reverse power alarm conditions 408, 410, occur when the reverse power is approximately above a threshold amplitude 412 of 1.5. As shown in FIG. 4, these alarm conditions 408, 410, occur at normalized phase positions from 0 to slightly after 0.2 (for alarm conditions 408) and from slightly after 0.8 to 1 (for alarm conditions 410). As can be seen from FIG. 4, an optimum phase angle for one transmitter output signal (to calibrate the relative phases of the two output signals from the two transmitters) may be selected, for example, from a middle position of the phase angles 0 to slightly after 0.2corresponding the alarm conditions 408 shown. Therefore, by controlling a phase adjuster 308 within a multiple transmitter system, the controller 602 can automatically, autonomously, and without manual intervention, calibrate into phase coherence the relative phases of the two output signals from the two transmitters using reverse power alarm information.

Figure 5:
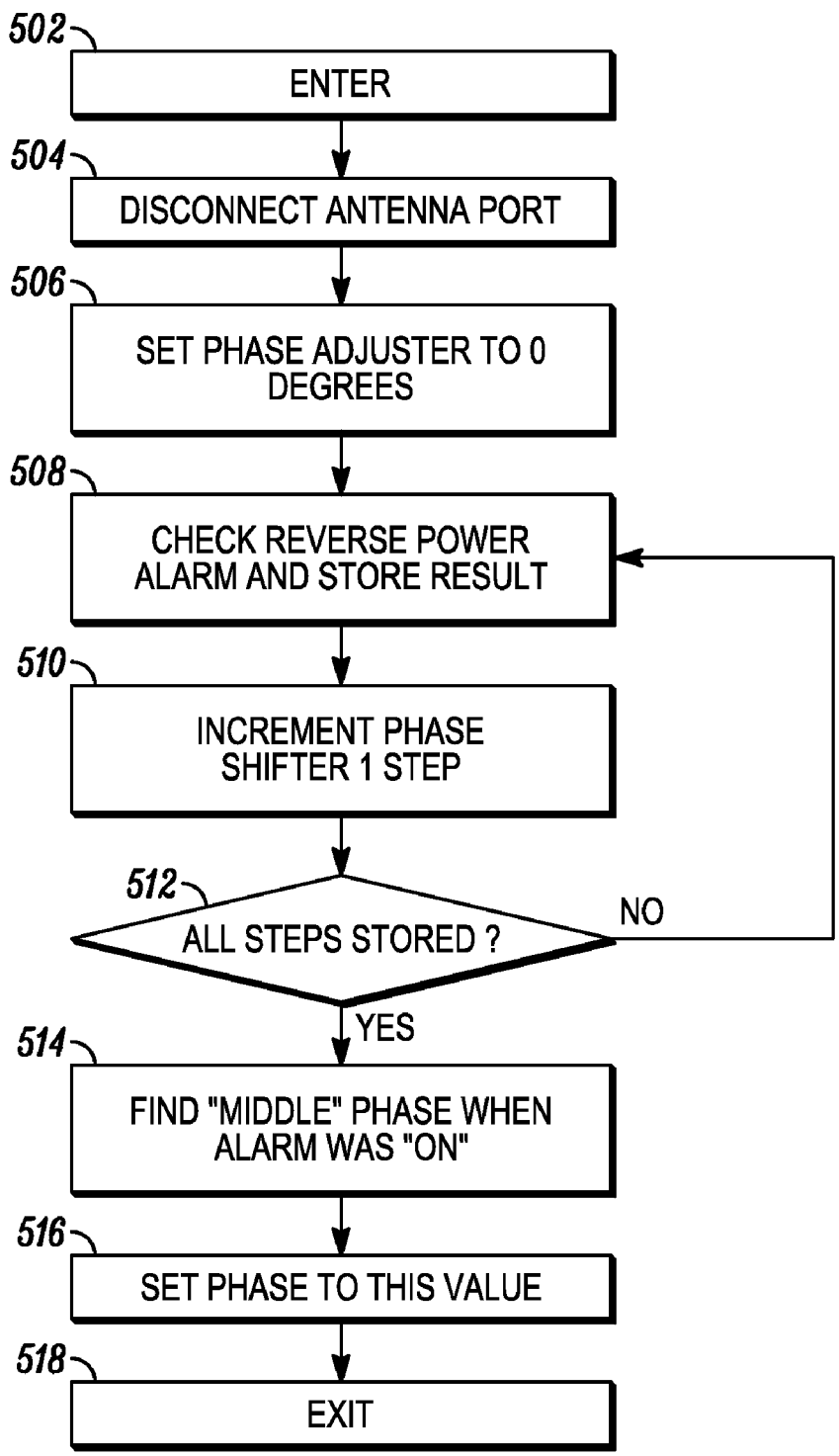
FIG. 5 is an operation flow diagram illustrating one example of self-calibrating the phase of a multi-transmitter system according to one embodiment of the present invention.

FIG. 5 is an operational flow diagram illustrating one process of self-calibrating the relative phases of two output signals from two transmitters in a combined multi-transmitter system 300. The operational flow diagram of FIG. 5 begins at step 502, and flows directly into step 504. The antenna port 306, at step 504, is disconnected from the transmitter system 300. As discussed above, this can be done automatically, autonomously, and without manual intervention, using a switch 350 under control of a controller 602. It can also be done with the assistance of a human. Alternatively, it could be done in any combination of automatic operation and manual intervention.

With the transmitter output disconnected from the antenna, the controller 602, at step 506, sets the phase adjuster 308 to 0 degrees for a phase position of an output signal from one of the transmitters 342, 344. The controller 602, at step 508, monitors the reverse power detector 348 for any generated reverse power alarms. The controller 6023 then stores information that identifies when a reverse alarm occurred or failed to occur.

The controller 602, at step 510, continues to adjust the phase position of the phase adjuster 308 by a given incremental phase position value until a 360 degrees (or equivalent) phase shift has occurred. For each of these incremental adjustments the controller 602 monitors and records if a reverse alarm occurred or failed to occur. The controller 602, at step 512, determines if data indicating reverse power alarm occurrences or non-occurrences has been stored (i.e., has a 360 phase position shift been completed). If the result of this determination is negative, the control flow returns to step 508. If the result of this determination is positive, the controller 602, at step 514, identifies a "middle" phase position out of all the positions of when a reverse power alarm occurred. For example, the controller 602 identifies the optimum phase by selecting a phase angle from the middle of the phase positions when reverse power alarms where detected. The controller 602, at step 516, then sets the phase of at least one of the transmitters 302, 304 to the phase identified at step 514 so that the relative phases of the output signals of the two transmitters 302, 304 are substantially in phase with each other. The control flow then exits at step 518.

Figure 6:
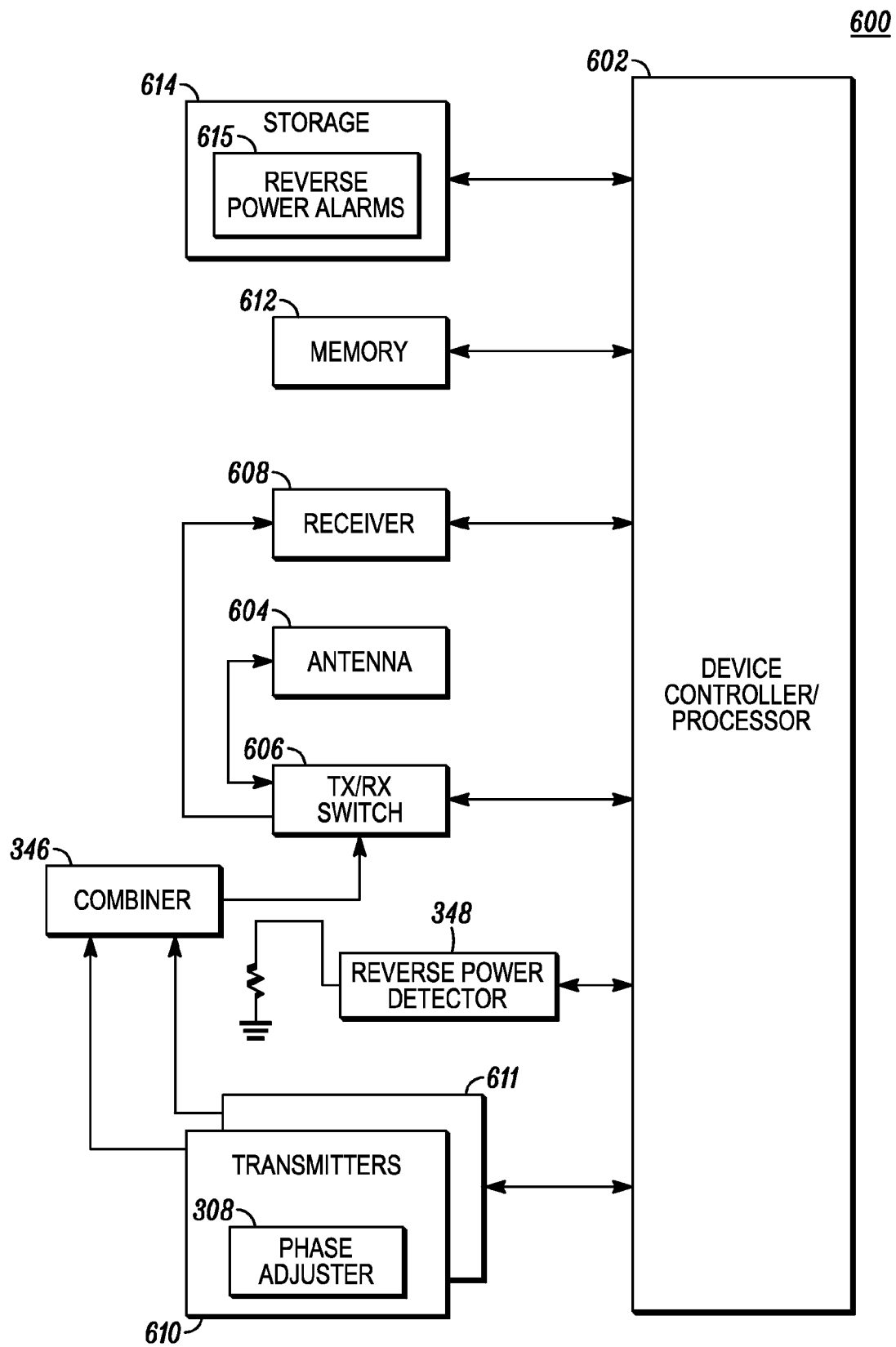
FIG. 6 is a block diagram illustrating a detailed view of a wireless device according to one embodiment of the present invention.

Referring now to FIG. 6, a more detailed view of a wireless device 600 is shown such as a wireless communication device 102, 104 or a base station 108. It is assumed that the reader is familiar with wireless devices. To simplify the present description, only that portion of a wireless device that is relevant to the present invention is discussed. The wireless device 600 shown in FIG. 6 operates under the control of a device controller/processor 602 that controls the sending and receiving of wireless communication signals and also performs the process discussed above with respect to FIG. 6. In receive mode, the device controller 602 electrically couples an antenna 604 through a transmit/receive switch 606 to at least one receiver 608. The receiver 608 decodes the received signals and provides those decoded signals to the device controller 602.

In transmit mode, the device controller 602 electrically couples the antenna 604, through the transmit/receive switch 606, to a plurality of transmitters 610, 611. One or more of these transmitters 610, 611 include a phase adjuster 308. The phase adjuster 308 has already been discussed above, and therefore, for the sake of brevity, will not be discussed in great detail here. The transmitters 610, 611 are configured similar to the transmitter system 300 of FIG. 3 and therefore, for the sake of brevity, will not be discussed in great detail here. A combiner 346 is also included in the wireless device. The combiner 346 combines the respective output signals from each of the transmitters 610, 611.

The transmit/receive switch 606, can include a diplexor/duplexor circuit for coupling transmitted signals from the transmitters to the antenna and received signals from the antenna to the receiver(s) 608. The transmit/receive switch 606, according to the present example, includes a switch circuit that, under control of the controller 602, can disconnect the output of the transmitters 610, 611, coupled via the combiner 346, from the antenna 604, similar to the operation of the switch 350 as has been discussed above. Alternatively, a separate additional switch (not shown) can be disposed between the output of the combiner 346 and the antenna 604. Lastly, a reverse power detector 348 is electrically coupled to the output of the combiner 348 for detecting reverse power.

It should be noted that in one embodiment, the at least one receiver 608 and the transmitters 610, 611 comprise dual mode receivers and dual mode transmitters for receiving/transmitting over various access networks providing different air interface types. The wireless device 600 also includes a memory 612 and non-volatile storage 614. The memory 612 and/or non-volatile storage 614 can include instructions, and store parameters, to perform the self-calibrating process discussed above with reference to FIG. 5. Also, reverse power alarm information 615 can be stored in the memory 612 and/or non-volatile storage 614 so that calibrating, or optionally self-calibrating, operations can be performed. As can be appreciated by the discussions above, various embodiments of the present invention use the reverse power detector circuit 348 in a new, unexpected and novel way to help a wireless device, or a transmitter system, to calibrate, or optionally self-calibrate, operations of the transmitters 610, 611 being combined by the combiner 346.

A reverse power detector circuit 348 may be already present in some wireless devices, and in some transmitter systems, typically to detect that the antenna 604 and/or an antenna port connection is/are disconnected or defectively connected with the output of the transmitters 610, 611. By utilizing such a reverse power detector circuit 348 in a new, unexpected and novel way to help calibrate, or optionally self-calibrate, operations of the transmitters 610, 611, this additionally reduces the cost of implementing such a calibration system.

Although specific embodiments of the invention have been disclosed, those having ordinary skill in the art will understand that changes can be made to the specific embodiments without departing from the spirit and scope of the invention. The scope of the invention is not to be restricted, therefore, to the specific embodiments, and it is intended that the appended claims cover any and all such applications, modifications, and embodiments within the scope of the present invention.

What is claimed is:

1. A method, with a wireless device, for calibrating relative phase of a plurality of output signals from respectively combined plurality of transmitters in the wireless device, the method comprising:
   disconnecting an output of a combiner from an antenna port of a wireless device, wherein the combiner combines separate output signals from at least two transmitters in the wireless device into a single combined signal;
   setting a phase position of an output signal from one of the at least two transmitters to an initial phase position value, and incrementing the phase position of the output signal by a given phase increment value until a final phase position value is reached;
   monitoring for occurrence of reverse power alarm events at the initial phase position value, at each incremental phase position value, and at the final phase position value; and
   selecting, based on the monitoring, a phase position value for the output signal.

2. The method of claim 1, further comprising:
   setting a phase of the output signal to a selected phase position value that was monitored as being associated with an occurrence of a reverse power alarm event.

3. The method of claim 1, wherein the selecting comprises:
   selecting, based on the monitoring, a phase position value for the output signal that is substantially in a middle position of all phase position values having been monitored as being associated with occurrence of a reverse power alarm event.

4. The method of claim 3, further comprising:
   setting a phase of the output signal to the selected phase position value that was substantially in the middle position of all phase position values.

5. The method of claim 3, wherein the phase position value for the output signal is selected to a phase position value being determined to set the relative phases of the output signals of the at least two transmitters to be substantially in phase with each other.

6. The method of claim 1, wherein the setting, monitoring, and selecting, are performed automatically, autonomously, and without manual intervention.

7. The method of claim 1, wherein the disconnecting, setting, monitoring, and selecting, are performed automatically, autonomously, and without manual intervention.

8. A wireless communication device for calibrating relative phase of a plurality of output signals from respectively combined plurality of transmitters in the wireless communication device, the wireless communication device comprising:
   a memory;
   a processor communicatively coupled to the memory;
   at least two transmitters each comprising a phase adjuster;
   a combiner communicatively coupled to the at least two transmitters, wherein the combiner combines separate output signals from at the least two transmitters into a single combined signal;
   an antenna communicatively coupled to the transmitters;
   a switch communicatively coupled to the antenna and the combiner; and
   a controller communicatively coupled at least the memory, the processor, the switch, and the at least two transmitters, wherein the controller is adapted to:
      autonomously, and without manual intervention, activate the switch to disconnect an output of the combiner from the antenna;
      set a phase position, via the phase adjuster, of an output signal from at least one of the at least two transmitters to an initial phase position value, and incrementing the phase position of the output signal by a given phase increment value until a final phase position value is reached;
      monitor for occurrence of reverse power alarm events at the initial phase position value, at each incremental phase position value, and at the final phase position value; and
      select, based on the occurrence of reverse power alarm events being monitored, a phase position value for the output signal.

9. The wireless communication device of claim 8, wherein the controller is further adapted to:
   set a phase of the output signal to a selected phase position value that was monitored as being associated with an occurrence of a reverse power alarm event.

10. The wireless communication device of claim 8, wherein the controller is further adapted to select by:
    selecting, based on the occurrence of reverse power alarm events being monitored, a phase position value for the output signal that is substantially in a middle position of all phase position values having been monitored as being associated with occurrence of a reverse power alarm event.

11. The wireless communication device of claim 10, wherein the controller is further adapted to
    set a phase of the output signal to the selected phase position value that was substantially in the middle position of all phase position values.

12. The wireless communication device of claim 10, wherein the phase position value for the output signal is selected to a phase position value being determined to set the relative phases of the output signals of the at least two transmitters to be substantially in phase with each other.

13. The wireless communication device of claim 8, wherein the controller is adapted to set, monitor, and select automatically, autonomously, and without manual intervention.

14. The wireless communication device of claim 8, wherein the controller is adapted to disconnect, set, monitor, and select automatically, autonomously, and without manual intervention.

15. A wireless device for calibrating relative phase of a plurality of output signals from respectively combined plurality of transmitters in the wireless communication device, the wireless communication device comprising:
    a memory;
    a processor communicatively coupled to the memory;
    at least two transmitters each comprising a phase adjuster;
    a combiner communicatively coupled to the at least two transmitters, wherein the combiner combines separate output signals from at the least two transmitters into a single combined signal;
    an antenna communicatively coupled to the transmitters; and
    a controller communicatively coupled at least the memory, the processor, and the at least two transmitters, wherein the controller is adapted to:
       disconnect an output of a combiner from the antenna;
       set a phase position, via the phase adjuster, of an output signal from one of the at least two transmitters to an initial phase position value, and incrementing the phase position of the output signal by a given phase increment value until a final phase position value is reached;

monitor for occurrence of reverse power alarm events at the initial phase position value, at each incremental phase position value, and at the final phase position value; and select, based on the occurrence of reverse power alarm events being monitored, a phase position value for the output signal.

16. The wireless device of claim 15, wherein the controller is further adapted to:

set a phase of the output signal to a selected phase position value that was monitored as being associated with an occurrence of a reverse power alarm event.

17. The wireless device of claim 15, wherein the controller is further adapted to select by:

selecting, based on the occurrence of reverse power alarm events being monitored, a phase position value for the output signal that is substantially in a middle position of all phase position values having been monitored as being associated with occurrence of a reverse power alarm event.

18. The wireless device of claim 17, wherein the controller is further adapted to set a phase of the output signal to the selected phase position value that was substantially in the middle position of all phase position values.

19. The wireless device of claim 17, wherein the phase position value for the output signal is selected to a phase position value being determined to set the relative phases of the output signals of the at least two transmitters to be substantially in phase with each other.

20. The wireless device of claim 15, wherein the controller automatically, autonomously, and without manual intervention, selects the phase position value for the output signal and sets a phase of the output signal to the selected phase position value.

* * * * *